(12) United States Patent
Ahn et al.

(10) Patent No.: US 10,248,340 B2
(45) Date of Patent: Apr. 2, 2019

(54) SEMICONDUCTOR APPARATUS, MEMORY MODULE AND OPERATION METHOD THEREOF

(71) Applicant: SK hynix Inc., Icheon-si Gyeonggi-do (KR)

(72) Inventors: Nam Young Ahn, Seoul (KR); Kyung Hoon Kim, Seongnam-si (KR); Hyun Jung Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 103 days.

(21) Appl. No.: 15/642,795

(22) Filed: Jul. 6, 2017

(65) Prior Publication Data

US 2018/0203621 A1    Jul. 19, 2018

(30) Foreign Application Priority Data

Jan. 18, 2017    (KR) ........................ 10-2017-0008507

(51) Int. Cl.

| G06F 3/06 | (2006.01) |
| G11C 8/06 | (2006.01) |
| G11C 7/10 | (2006.01) |
| G11C 7/14 | (2006.01) |
| G11C 7/24 | (2006.01) |
| G11C 5/04 | (2006.01) |

(52) U.S. Cl.
CPC ............ *G06F 3/0619* (2013.01); *G06F 3/065* (2013.01); *G06F 3/0659* (2013.01); *G06F 3/0688* (2013.01); *G11C 7/10* (2013.01); *G11C 7/14* (2013.01); *G11C 7/24* (2013.01); *G11C 8/06* (2013.01); *G11C 5/04* (2013.01)

(58) Field of Classification Search
CPC ...... G06F 3/0619; G06F 3/065; G06F 3/0659; G06F 3/0688; G11C 7/10; G11C 7/14; G11C 7/24; G11C 8/06; G11C 5/04
See application file for complete search history.

(56) References Cited

U.S. PATENT DOCUMENTS

| 9,299,400 B2 | 3/2016 | Bains et al. | |
| 9,478,263 B2 * | 10/2016 | Ni | .......................... G11C 11/408 |
| 9,478,316 B1 * | 10/2016 | Ryu | ....................... G11C 29/785 |
| 9,741,421 B1 * | 8/2017 | Hedden | .................. G11C 11/406 |

FOREIGN PATENT DOCUMENTS

KR    1020130026973 A    3/2013

* cited by examiner

*Primary Examiner* — Eric Cardwell
(74) *Attorney, Agent, or Firm* — William Park & Associates Ltd.

(57) ABSTRACT

A memory module may be provided. The memory module may include a normal memory device, a spare memory device, and a row hammering determination circuit. The row hammering determination circuit may be configured to control the spare memory device to perform a data input and output operation, instead of a data input and output operation with the normal memory device in which row hammering has occurred.

20 Claims, 6 Drawing Sheets

FIG.3

| Rank | Bank | Row Address | Hit Information | Dirty Write Information |
|------|------|-------------|-----------------|-------------------------|
| 0 | 0 | 0 X 2332 | 0 | 0 |
| 0 | 2 | 0 X 200 | 0 | 0 |
| 0 | 3 | 0 X 100 | 1 | 1 |
| 1 | 14 | 0 X A0 | 0 | 0 |
| 0 | 2 | 0 X C10 | 0 | 0 |

SEMICONDUCTOR APPARATUS, MEMORY MODULE AND OPERATION METHOD THEREOF

CROSS-REFERENCES TO RELATED APPLICATION

The present application claims priority under 35 U.S.C. § 119(a) to Korean application number 10-2017-0008507, filed on Jan. 18, 2017, in the Korean Intellectual Property Office, which is incorporated herein by reference in its entirety.

BACKGROUND

1. Technical Field

Various embodiments may generally relate to a semiconductor technology, and more particularly, to a memory device and a memory module.

2. Related Art

An electronic device may include a number of electronic components, and a large part of the electronic components may be implemented with a computer system semiconductor. Among semiconductor devices constituting a computer system, a host such as a processor or memory controller may communicate with a memory device. The memory device may include a plurality of memory cells which can be located and specified by word lines and bit lines, and store data. The host for controlling the memory device may access the memory device such that the memory device can perform an input and output (input/output) operation. In order to access the memory device, the host may provide an address signal to select a specific memory cell, and provide a command signal such that the memory device stores data or outputs data stored therein. At this time, when consecutive access requests for a specific word line or bit line are received, hammering may occur in memory cells around a memory cell coupled to the specific word line and bit line. Then, data stored in the memory cells may be lost. This phenomenon is generally referred to as row hammering. Recently, research has been conducted on a variety of methods for mitigating row hammering.

SUMMARY

In an embodiment, a memory module may be provided. The memory module may include a normal memory device. The memory module may include a spare memory device. The memory module may include a path selection circuit coupled to one of the normal memory device and the spare memory device based on a path selection signal. The memory module may include a row hammering determination circuit configured to monitor an address signal and generate a hit signal and the path selection signal based on whether the same address signal has been consecutively inputted by a number of times equal to or more than a threshold value.

In an embodiment, there may be provided an operation method of a memory module including a normal memory device and a spare memory device. The operation method may include monitoring an address signal to determine whether row hammering has occurred. The operation method may include coupling the normal memory device to the spare memory device, when a row hammering address is inputted after the row hammering has occurred. The operation method may include performing, by the spare memory device, a data input and output (input/output) operation.

In an embodiment, there may be provided a memory module. The memory module may include a normal memory device, a spare memory device, and a row hammering determination circuit. The row hammering determination circuit may be configured to control the spare memory device to perform a data input and output operation, instead of a data input and output operation with the normal memory device in which row hammering has occurred.

BRIEF DESCRIPTION OF THE DRAWINGS

FIG. 3 is a table exemplifying row hammering information stored in an address table logic circuit illustrated in FIG. 2.

DETAILED DESCRIPTION

Hereinafter, a memory device and a memory module will be described below with reference to the accompanying drawings through various examples of embodiments.

Figure 1:
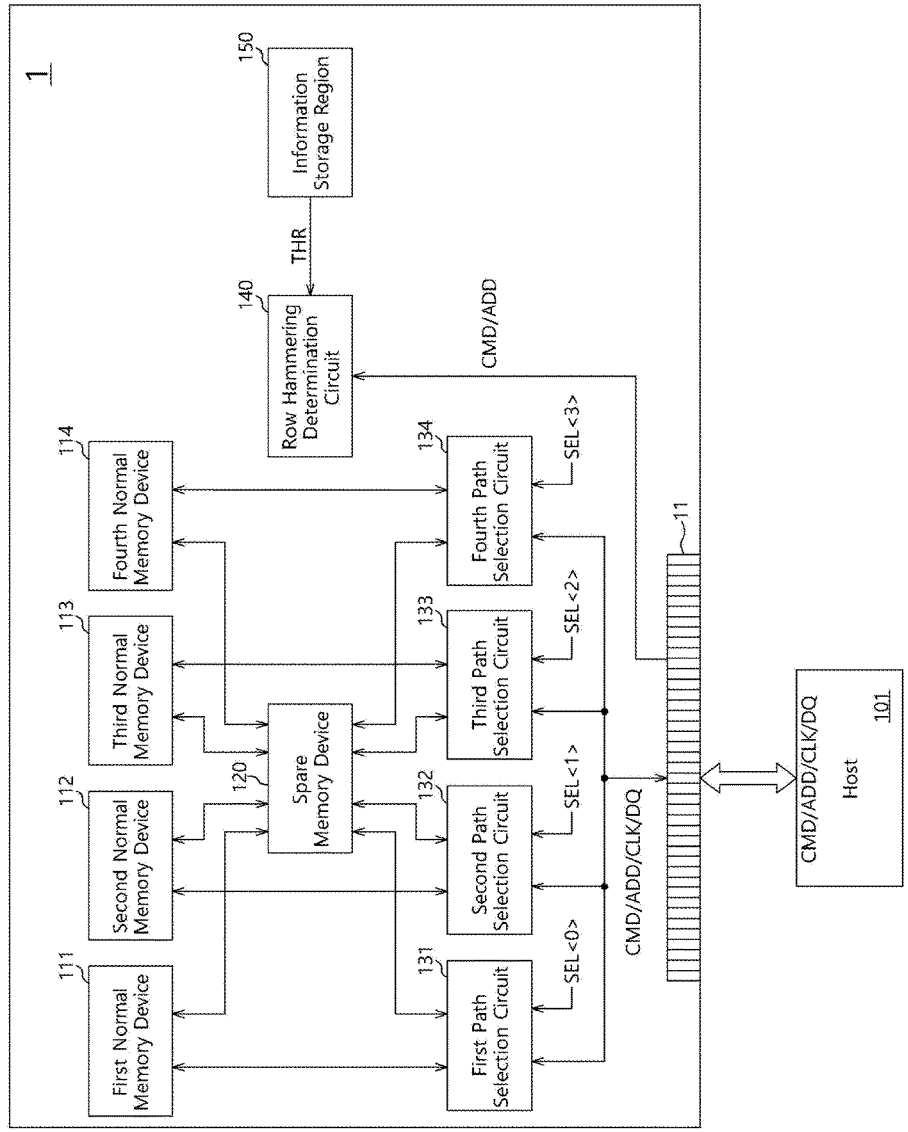
FIG. 1 is a diagram illustrating a configuration of a memory module in accordance with an embodiment.

FIG. 1 is a diagram illustrating a configuration of a memory module 1 in accordance with an embodiment. Referring to FIG. 1, the memory module 1 may communicate with an external device such as a host 101 and perform a data input/output operation. The host 101 may access the memory module 1 such that the memory module 1 can perform a data input/output operation. The host 101 may provide various control signals to the memory module 1 in order to control the data input/output operation of the memory module 1. For example, the host 101 may transmit a command signal CMD, address signal ADD, clock signal CLK and data DQ to the memory module 1, and store the data DQ in the memory module 1. An operation in which the host 101 transmits the data DQ to the memory module 1 and the memory module 1 stores the data DQ may be referred to as a write operation. The host 101 may transmit the command signal CMD, the address signal ADD and the clock signal CLK to the memory module 1, and receive the data DQ stored in the memory module 1. An operation of the memory module 1 to output the data stored therein to the host 101 may be referred to as a read operation.

The memory module 1 may include one or more normal memory devices 111 to 114, one or more spare memory devices 120, one or more path selection circuits 131 to 134 and a row hammering determination circuit 140. FIG. 1 illustrates four normal memory devices and one spare memory device. However, the present embodiments are not limited thereto, but the numbers of the normal memory devices and the spare memory devices may be changed if necessary. The first to fourth normal memory devices 111 to 114 may be coupled to the spare memory device 120. The normal memory devices 111 to 114 may include a volatile memory device and a nonvolatile memory device. The volatile memory device may include Dynamic RAM (DRAM) and Synchronous DRAM (SDRAM), and the nonvolatile memory device may include Read Only Memory (ROM), Programmable ROM (PROM), Electrically Erase and Programmable ROM (EEPROM), Electrically Programmable ROM (EPROM), Flash memory, Phase change RAM (PRAM), Magnetic RAM (MRAM), Resistive RAM (RRAM), Ferroelectric RAM (FRAM) and the like. The spare memory device 120 may be implemented with a different type of memory device from the normal memory devices. For example, the spare memory device 120 may include, for example but not limited to, Static RAM (SRAM).

The first to fourth path selection circuits 131 to 134 may receive path selection signals SEL<0:3> allocated thereto, respectively. The first to fourth path selection circuits 131 to 134 may be coupled to the first to fourth normal memory devices 111 to 114, respectively, and coupled to the spare memory device 120 in common. The number of the path selection circuits 131 to 134 may correspond to the number of the normal memory devices 111 to 114. The path selection circuits 131 to 134 may receive the command signal CMD, the address signal ADD, the clock signal CLK, and the data DQ from the host 101 through a module pin 11, and transmit the signals to the first to fourth normal memory devices 111 to 114 and the spare memory device 120. Also, the path selection circuits 131 to 134 may receive data DQ from the first to fourth normal memory devices 111 to 114 and the spare memory device 120, and transmit the data DQ to the host 101 through the module pin 11. The first path selection circuit 131 may be coupled to one of the first normal memory device 111 and the spare memory device 120, based on the path selection signal SEL<0>. The second path selection circuit 132 may be coupled to one of the second normal memory device 112 and the spare memory device 120, based on the path selection signal SEL<1>. The third path selection circuit 133 may be coupled to one of the third normal memory device 113 and the spare memory device 120, based on the path selection signal SEL<2>. The fourth path selection circuit 134 may be coupled to one of the fourth normal memory device 114 and the spare memory device 120, based on the path selection signal SEL<3>.

The row hammering determination circuit 140 may receive the address signal ADD and the command signal CMD through the module pin 11. The row hammering determination circuit 140 may receive the address signal ADD, and determine whether the same address signal has been consecutively inputted by the number of times equal to or more than a threshold value. The row hammering determination circuit 140 may generate a hit signal depending on the determination result. When the same address signal is consecutively inputted by the number of times equal to or more than the threshold value, row hammering may occur. Hereafter, an address signal at which row hammering has occurred may be referred to as a row hammering address signal. The row hammering determination circuit 140 may enable the path selection signal SEL<0:3> when an address signal ADD inputted after the hit signal was generated is the row hammering address signal. For example, the row hammering determination circuit 140 may generate the hit signal when a specific address signal related to the first normal memory device 111 is consecutively received from the host 101 by the number of times equal to or more than the threshold value, and enable the path selection signal SEL<0> when the specific address signal is inputted again. When the path selection signals SEL<0:3> are disabled, the path selection circuits 131 to 134 may be coupled to the normal memory devices 111 to 114, respectively. Therefore, the normal memory devices 111 to 114 may perform a data input/output operation. When the path selection signals SEL<0:3> are enabled, the path selection circuits 131 to 134 may be coupled to the spare memory device 120. Therefore, the spare memory device 120 may perform a data input/output operation. The row hammering determination circuit 140 can control the spare memory device 120 to perform a data input/output operation, instead of the normal memory device in which row hammering occurred, thereby improving the reliability of the memory module 1.

The row hammering determination circuit 140 may perform a data backup operation when the hit signal is generated. When the hit signal is generated, the row hammering determination circuit 140 may back up and/or transfer and store data into the spare memory device 120, the data being stored in the normal memory device in which row hammering occurred. In an embodiment, when an address signal ADD inputted after the hit signal was generated is the row hammering address signal, the row hammering determination circuit 140 may perform the data backup operation based on a command signal CMD corresponding to the row hammering address signal. For example, when the command signal CMD is a write signal for a write operation, the row hammering determination circuit 140 may not perform the data backup operation. When the command signal CMD is not a write signal for a write operation, the row hammering determination circuit 140 may transfer and store data into the spare memory device 120, the data being stored in the normal memory device in which the row hammering occurred. For example, when the command signal CMD is a read signal for a read operation, the row hammering determination circuit 140 may transfer and store the data into the spare memory device 120, the data being stored in the normal memory device in which the row hammering occurred.

The row hammering determination circuit 140 may be reset when a predetermined time elapses after the hit signal was generated. The predetermined time may correspond to a time required until a refresh operation is completed after the hit signal was generated. When the refresh operation is performed, data stored in the normal memory devices 111 to 114 can be refreshed to remove the possibility that the data will be lost due to the occurrence of the row hammering. Therefore, when the refresh operation is completed, the row hammering determination circuit 140 may disable the path selection signals SEL<0:3> to couple the path selection circuits 131 to 134 to the normal memory devices 111 to 114. At this time, the row hammering determination circuit 140 may perform a data recovery operation. When the predetermined time elapses, the row hammering determination circuit 140 may transfer and store the data stored in the spare memory device 120 into the normal memory devices 111 to 114. The row hammering determination circuit 140 may store information on the command signal CMD received in response to the row hammering address signal, after the hit signal was generated. In an embodiment, the row hammering determination circuit 140 may perform the data recovery operation based on the information on the command signal CMD received in response to the row hammering address signal. For example, when one or more write signals are included in the received command signals CMD, the row hammering determination circuit 140 may recovers and/or transfer and store the data stored in the spare memory device 120 into the normal memory devices 111 to 114. When data are stored in the spare memory devices 120 according to the one or more write signals, the data recovery operation needs to be performed because the data stored in the spare memory device 120 may be different from the data stored in the normal memory devices 111 to 114. When no write signals are included in the received command signals CMD, the row hammering determination circuit 140 may not perform the data recovery operation. When no data are stored in the spare memory device 120, for example, when the spare memory device 120 performs only a data output operation, the data stored in the spare memory device 120 may coincide with the data stored in the normal memory devices 111 to 114. In this case, the data recovery operation may not be needed.

The memory module 1 may further include an information storage region 150. The information storage region 150 may store information on the threshold value THR, and provide the threshold value THR to the row hammering determination circuit 140. The information storage region 150 may be implemented with, for example but not limited to a, SPD EEPROM (Serial Presence Detect Electrically Erasable and Programmable Read Only Memory) that stores serial presence detect information.

Figure 2:
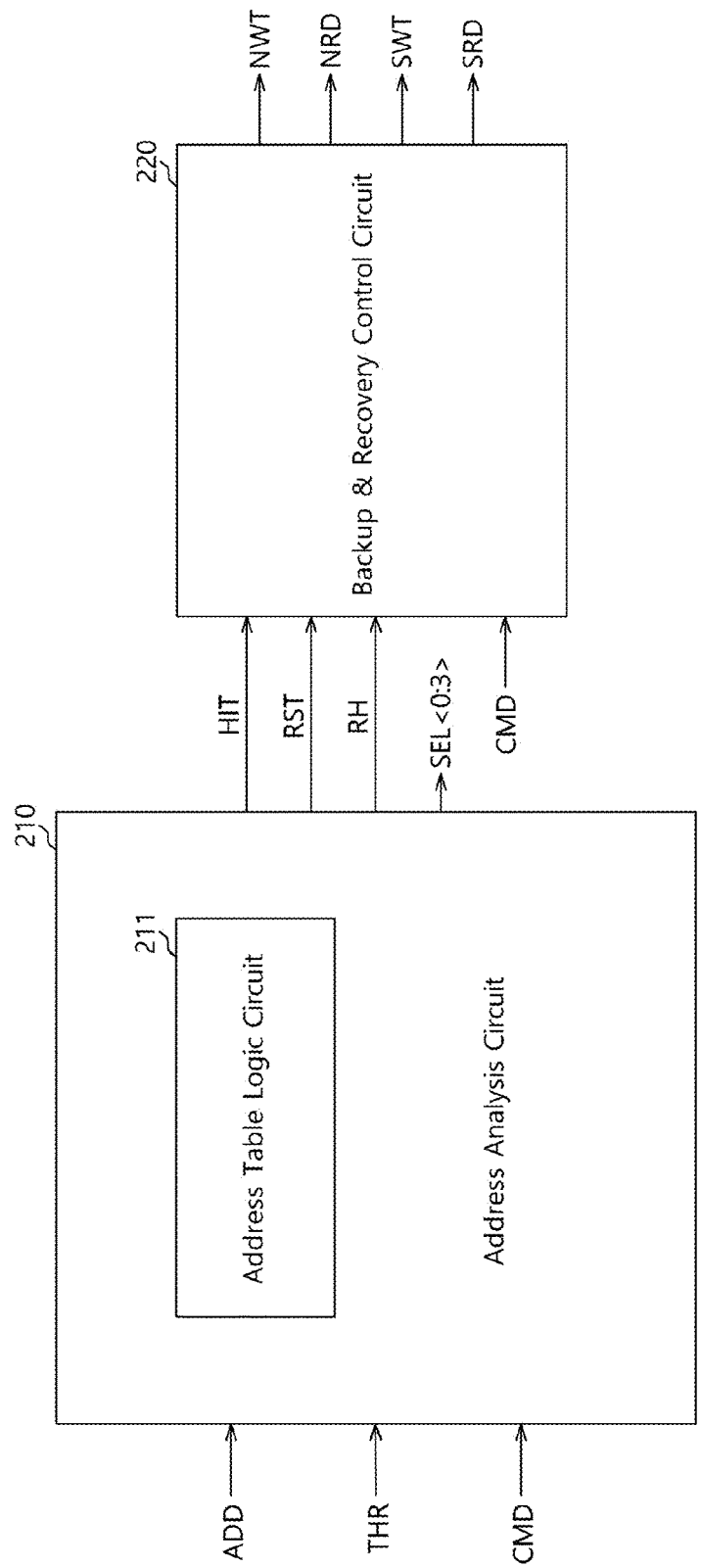
FIG. 2 is a diagram illustrating a configuration of an address determination circuit of FIG. 1.

FIG. 2 illustrates the configuration of the row hammering determination circuit 140 of FIG. 1. Referring to FIGS. 1 and 2, the row hammering determination circuit 140 may include an address analysis circuit 210 and a backup and recovery control circuit 220. The address analysis circuit 210 may receive the address signal ADD and the command signal CMD from the host 101. The address analysis circuit 210 may receive the threshold value THR from the information storage region 150. The address analysis circuit 210 may monitor the address signal ADD, and generate the hit signal HIT when a specific address signal is consecutively inputted by the number of times equal to or more than the threshold value. The specific address signal which is consecutively inputted by the number of times equal to or more than the threshold value may correspond to a row hammering address which is one of multiple pieces of row hammering information RH. The address analysis circuit 210 may include an address table logic circuit 211. The address analysis circuit 210 may store the row hammering information RH in the address table logic circuit 211. The address analysis circuit 210 may enable the path selection signals SEL<0:3>, when the address signal ADD inputted from the host 101 corresponds to the row hammering address signal after the hit signal HIT was generated. The address analysis circuit 210 may receive a refresh command signal as the command signal CMD. The address analysis circuit 210 may generate a reset signal RST when a refresh operation is performed after the refresh command signal was inputted.

The address table logic circuit 211 may store the row hammering information RH generated by the address analysis circuit 210. The address table logic circuit 211 may be reset in response to the reset signal RST. The row hammering information RH will be described later.

The backup and recovery control circuit 220 may receive the hit signal HIT, the reset signal RST, the row hammering information RH, and the command signal CMD. The backup and recovery control circuit 220 may generate a normal write signal NWT and normal read signal NRD for controlling the normal memory devices 111 to 114 and a spare write signal SWT and spare read signal SRD for controlling the spare memory device 120, based on the hit signal HIT, the reset signal RST, the row hammering information RH, and the command signal CMD. For the data backup operation, the backup and recovery control circuit 220 may generate the normal read signal NRD and the spare write signal SWT based on the hit signal HIT, the row hammering information RH, and the command signal CMD. The normal memory devices 111 to 114 may output data stored therein based on the normal read signal NRD, and the spare memory device 120 may store data outputted from the normal memory devices 111 to 114 based on the spare write signal SWT. For the data recovery operation, the backup and recovery control circuit 220 may generate the spare read signal SRD and the normal write signal NWT based on the reset signal RST and the row hammering information RH. The spare memory device 120 may output data stored therein based on the spare read signal SRD. The normal memory devices 111 to 114 may store data outputted from the spare memory device 120 based on the normal write signal NWT.

FIG. 3 is a table exemplifying the row hammering information RH stored in the address table logic circuit 211 of FIG. 2. Referring to FIGS. 2 and 3, the address analysis circuit 210 may store information on the address signal ADD in the address table logic circuit 211, when receiving the address signal ADD. The information on the address signal ADD may include rank information, bank information and row address information. The rank information may include information on ranks of the memory module 1. The memory module 1 may include a plurality of memory devices, and the plurality of memory devices may operate as a plurality of ranks. The address table logic circuit 211 may store rank information corresponding to the address signal ADD. For example, the address table logic circuit 211 may store "0" as the rank information when the rank corresponding to the address signal ADD is a first rank, and store "1" as the rank information when the rank corresponding to the address signal ADD is a second rank. The address table logic circuit 211 may store bank information and row address information corresponding to the address signal ADD.

The address table logic circuit 211 may store hit information. When the same address signal is consecutively inputted by the number of times equal to or more than the threshold value, the address analysis circuit 210 may generate the hit signal HIT. The address table logic circuit 211 may update hit information to "1" based on the hit signal HIT, the hit information indicating the address information at which the row hammering occurred. For example, when row hammering occurred at row address information corresponding to 0X2332 of the first memory bank in the first rank, the address table logic circuit 211 may update the hit information on the address information to "1".

The address table logic circuit 211 may also store dirty write information. When one or more write signals are included in the command signals CMD corresponding to the address signal ADD in the case where the address signal ADD coinciding with the row address information having the hit information updated to "1" is inputted, the address table logic circuit 211 may define this situation as dirty write, and update dirty write information to "1". The dirty write information may be required for the above-described data recovery operation. The backup and recovery control circuit 220 may generate the spare read signal SRD and the normal write signal NWT such that the data recovery operation is performed based on the dirty write information. The address table logic circuit 211 may reset the information stored therein when the reset signal RST is generated from the address analysis circuit 210 and the data recovery operation is completed.

Figure 4:
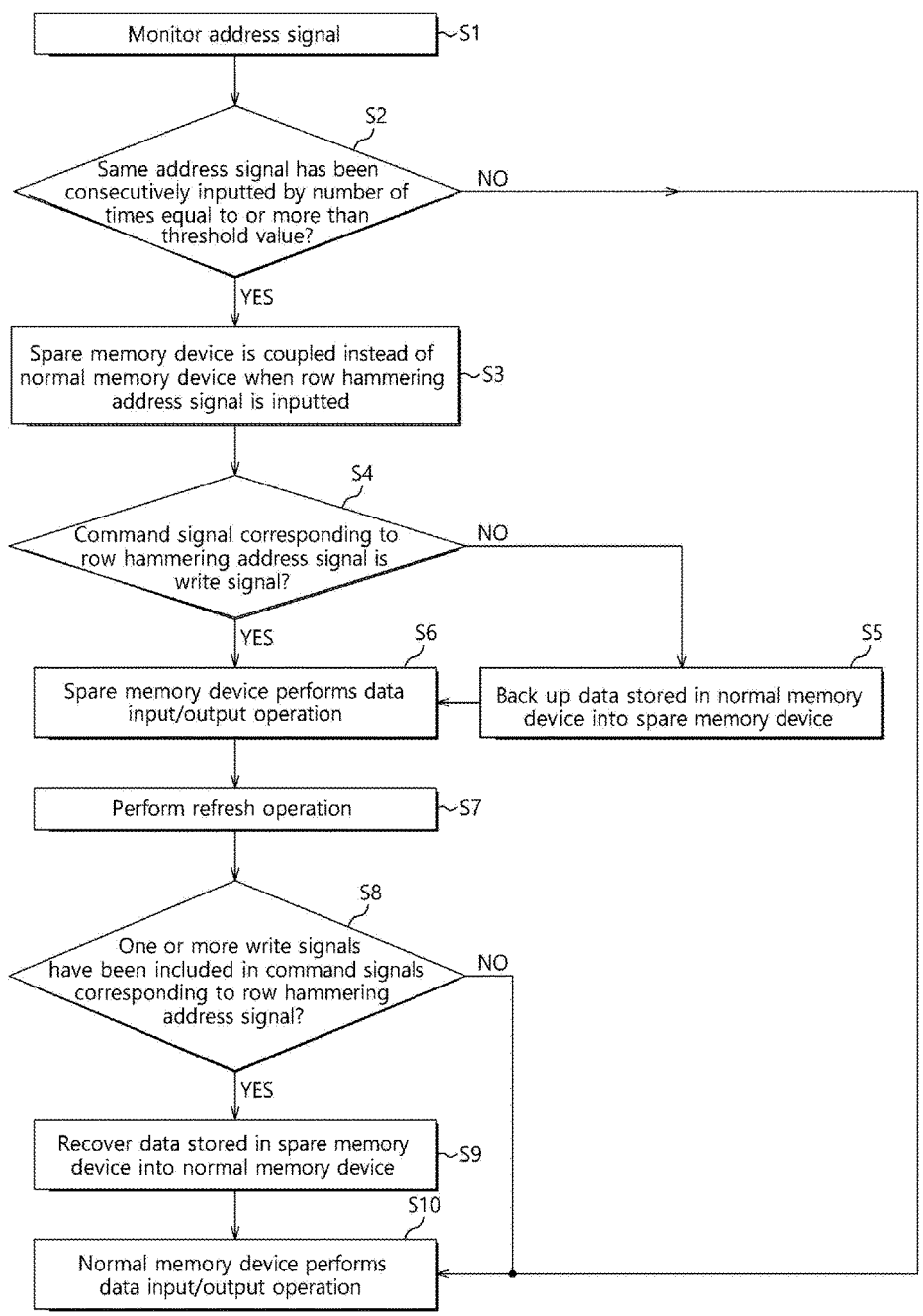
FIG. 4 is a flowchart illustrating an operation of the memory module in accordance with a present embodiment.

FIG. 4 is a flowchart illustrating the operation of the memory module in accordance with a present embodiment. Referring to FIGS. 1 to 4, the operation of the memory module 1 in accordance with a present embodiment will be described as follows. The row hammering determination circuit 140 may monitor an address signal ADD received from the host at step S1. The row hammering determination circuit 140 may determine whether the same address signal has been consecutively inputted by the number of times equal to or more than the threshold value, at step S2. When an address signal ADD which has been consecutively inputted by the number of times equal to or more than the threshold value is not present, the normal memory devices 111 to 114 may perform a data input/output operation at step S10. When it is sensed that the same address signal has been consecutively inputted by the number of times equal to or more than the threshold value, the address analysis circuit 210 may generate the hit signal HIT. Then, when the row hammering address signal is inputted, the address analysis circuit 210 may enable the path selection signals SEL<0:3> allocated to the path selection circuits 131 to 134 coupled to a normal memory device in which row hammering occurred, and the path selection circuits 131 to 134 may be coupled to the spare memory device 120 instead of the normal memory devices 111 to 114, at step S3.

The backup and recovery control circuit 220 may receive the row hammering information RH from the address analysis circuit 210, and determine whether the command signal CMD corresponding to the row hammering address signal is a write signal, at step S4. When the command signal CMD corresponding to the row hammering address signal is not a write signal, the backup and recovery control circuit 220 may perform a data backup operation. The backup and recovery control circuit 220 may generate the normal read signal NRD and the spare write signal SWT based on the row hammering information RH. Therefore, data stored in the normal memory device in which the row hammering occurred may be outputted, and the spare memory device 120 may store the data outputted from the normal memory device, at step S5. When the data backup operation is completed, the spare memory device may perform a data input/output operation corresponding to the row hammering address signal at step S6. When the command signal CMD corresponding to the row hammering address signal is a write signal, the spare memory device 120 may perform the data input operation, and then perform the data input/output operation corresponding to the row hammering address signal, at step S6.

Then, when a refresh operation is performed at step S7, a data recovery operation may be performed. When the refresh operation is completed, the address analysis circuit 210 may generate the reset signal RST, and determine whether one or more write signals have been included in the command signals CMD corresponding to the row hammering address signal, at step S8. That is, the address analysis circuit 210 may check the dirty write information in the address table logic circuit 211, and provide the row hammering information RH containing the dirty write information to the backup and recovery control circuit 220. If it were not for the write signal, the address table logic circuit 211 can be reset. Then, the normal memory devices 111 to 114 may perform a data input/output operation at step S10. However, if one or more write signals have been included, the backup and recovery control circuit 220 may generate the spare read signal SRD and the normal write signal NWT based on the reset signal RST and the row hammering information RH. Therefore, the spare memory device 120 may output the data stored therein, and the normal memory devices 111 to 114 may store the data outputted from the spare memory device 120. When the data recovery operation is completed, the address analysis circuit 210 may reset the address table logic circuit 211, and the normal memory devices 111 to 114 may perform a data input/output operation.

Figure 5:
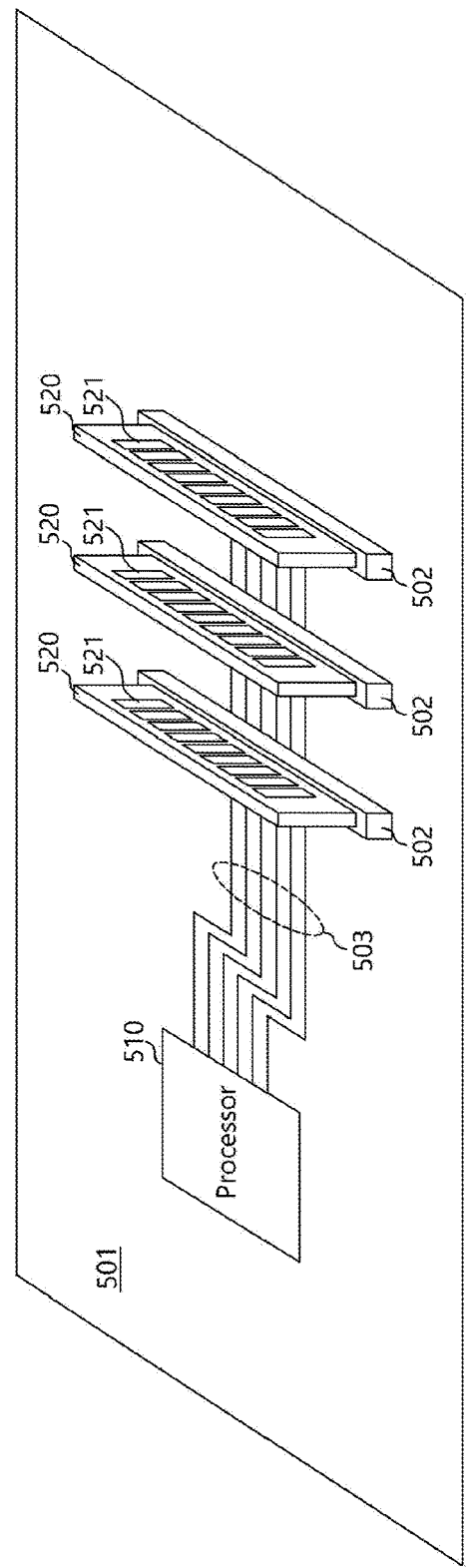
FIG. 5 is a diagram illustrating a configuration of a system in accordance with an embodiment.

FIG. 5 is a diagram illustrating a configuration of a system 5 in accordance with an embodiment. The system 5 may include a main board 501, a processor 510, and a memory module 520. The main board 501 for mounting components constituting the system may also be referred to as a mother board. The main board 501 may include a slot (not illustrated) in which the processor 510 can be mounted and a slot 502 in which the memory module 520 can be mounted. The main board 501 may include wirings 503 for electrically connecting the processor 510 and the memory module 520. The processor 510 may be mounted on the main board 501. The processor may include, for example but not limited to, a Central Processing Unit (CPU), Graphic Processing Unit (GPU), Multi-Media Processor (MMP), and digital signal processor. Furthermore, processor chips such as Application Processor (AP), which have various functions, may be combined and implemented in the form of System On Chip (SOC).

The memory module 520 may be mounted on the main board 501 through the slot 502 of the main board 501. The memory module 520 may be coupled to the wirings 503 of the main board 501 through the slot 502 and a module pin formed on a module board thereof. The memory module 520 may include UDIMM, DIMM, RDIMM, LRDIMM, SODIMM, NVDIMM, and the like. The memory module 1 illustrated in FIG. 1 may be applied as the memory module 520. The memory module 520 may include a plurality of memory devices 521. Each of the memory devices 521 may include one or more of a volatile memory device and a nonvolatile memory device. The volatile memory device may include SRAM, DRAM and SDRAM, and the nonvolatile memory device may include ROM, PROM, EEPROM, EPROM, Flash memory, PRAM, MRAM, RRAM and FRAM. The memory device 521 may include a stacked memory device or multi-chip package having a plurality of chips stacked therein.

Figure 6:
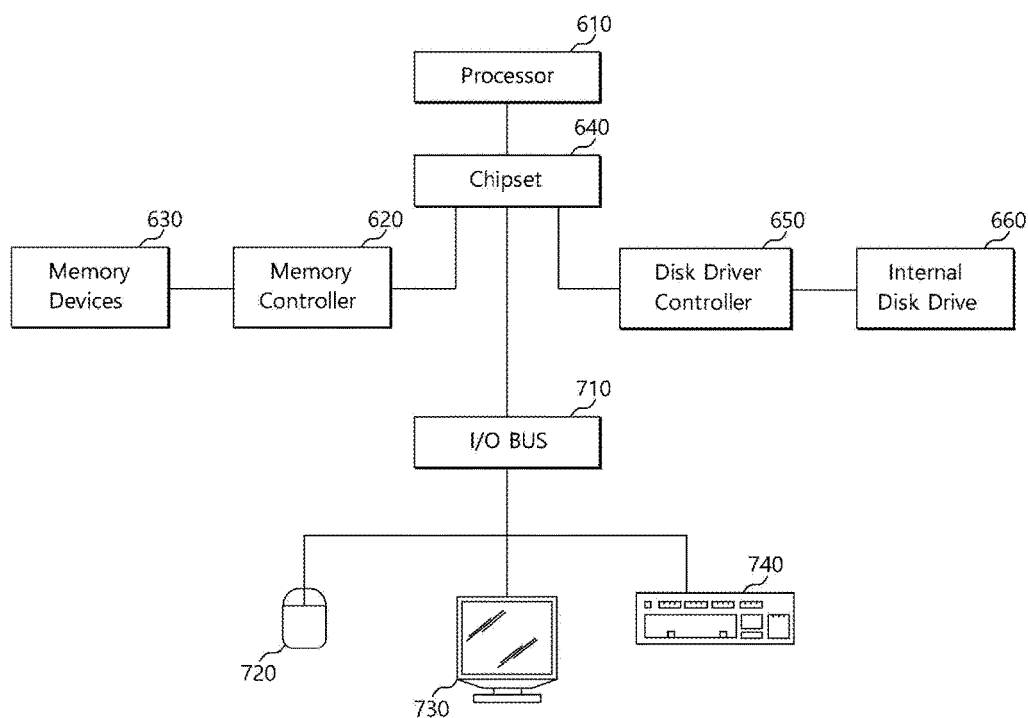
FIG. 6 is a diagram illustrating a configuration of a system in accordance with an embodiment.

FIG. 6 is a diagram illustrating a configuration of a system 6 in accordance with an embodiment. Referring to FIG. 6, the system 6 may include a processor 610, a memory controller 620, and a memory device 630. The processor 610 may be coupled to the memory controller 620 through a chip set 640, and the memory controller 620 may be coupled to the memory device 630 through a plurality of buses. FIG. 6 illustrates one processor 610. However, the present embodiments are not limited thereto, but the system may include a plurality of processors in a physical or logical manner. The chip set 640 may provide a communication path through which a signal is transmitted between the processor 610 and the memory controller 620. The processor 610 may perform an arithmetic operation, and transmit a request and data to the memory controller 620 through the chip set 640 in order to input/output desired data.

The memory controller 620 may transmit a command signal, address signal, clock signal, and data through the plurality of buses. The memory device 630 may store the data by receiving the signals from the memory controller 620, and output the stored data to the memory controller 620. The memory device 630 may include one or more memory modules, and the memory module 1 illustrated in FIG. 1 may be employed as the memory device 630.

Referring to FIG. 6, the system 6 may further include an input/output bus 710, an input/output device 720, 730, or 740, a disk driver controller 650 and an internal disk drive 660. The chip set 640 may be coupled to the input/output bus 710. The input/output bus 710 may provide a communication path for signal transmission from the chip set 640 to the input/output device 720, 730, or 740. The input/output device may include, for example but not limited to, a mouse 720, a video display 730 or a keyboard 740. The input/output bus 710 may include any communication protocols as long as the communication protocols can communicate with the input/output device 720, 730, or 740. The input/output bus 710 may be integrated in the chip set 640.

The disk driver controller 650 may be coupled to the chip set 640. The disk driver controller 650 may provide a communication path between the chip set 640 and one or more disk drives 660. The disk drive 660 may be utilized as an external data storage device for storing a command and data. The disk driver controller 650 and the disk drive 660 may communicate with each other or the chip set 640 through any communication protocols including the input/output bus 710.

While various embodiments have been described above, it will be understood to those skilled in the art that the embodiments described are examples only. Accordingly, the operating method of a data storage device described herein should not be limited based on the described embodiments.

What is claimed is:

1. A memory module comprising:
   a normal memory device;
   a spare memory device;
   a path selection circuit coupled to one of the normal memory device and the spare memory device based on a path selection signal; and
   a row hammering determination circuit configured to monitor an address signal and generate a hit signal and the path selection signal based on whether the same address signal has been consecutively inputted by a number of times equal to or more than a threshold value.

2. The memory module of claim 1, wherein the spare memory device comprises a different type of memory device from the normal memory device.

3. The memory module of claim 1, wherein when the path selection signal is disabled, the path selection circuit is coupled to the normal memory device, and the normal memory device performs a data input and output (input/output) operation.

4. The memory module of claim 3, wherein when the path selection signal is enabled, the path selection circuit is coupled to the spare memory device, and the spare memory device performs a data input/output operation.

5. The memory module of claim 1, wherein the row hammering determination circuit generates the hit signal when the same address signal has been consecutively inputted by the number of times equal to or more than the threshold value, and enables the path selection signal when a row hammering address signal is inputted after the hit signal is generated.

6. The memory module of claim 1, wherein the row hammering determination circuit backs up data stored in the normal memory device into the spare memory device, based on a command signal related to the row hammering address signal, after the hit signal is generated.

7. The memory module of claim 6, wherein the row hammering determination circuit does not perform the data backup operation when the command signal related to the row hammering address signal is a write signal.

8. The memory module of claim 1, wherein the row hammering determination circuit recovers data stored in the spare memory device into the normal memory device after a predetermined time has elapsed, and the predetermined time corresponds to a time required until a refresh operation of the normal memory device is completed from the point of time that the hit signal was generated.

9. The memory module of claim 8, wherein the row hammering determination circuit does not perform the data recovery operation when a command signal related to the row hammering address signal inputted after the hit signal was generated does not include a write signal.

10. The memory module of claim 1, wherein the row hammering determination circuit comprises:
    an address analysis circuit configured to receive an address signal, count how many times the same address signal is consecutively inputted, and enable the hit signal, row hammering information, and the path selection signal;
    an address table logic circuit configured to store information on the address signal, hit information, and dirty write information; and
    a backup and recovery control circuit configured to generate a normal write signal and normal read signal for controlling the normal memory device and a spare write signal and spare read signal for controlling the spare memory device, based on the row hammering information and a command signal, for a data backup and recovery operation.

11. The memory module of claim 1, wherein the memory module further comprises an information storage region, and the information storage region stores the threshold value and provides the threshold value to the row hammering determination circuit.

12. An operation method of a memory module including a normal memory device and a spare memory device, the operation method comprising:
    monitoring an address signal to determine whether row hammering has occurred;
    coupling the normal memory device to the spare memory device, when a row hammering address is inputted after the row hammering has occurred; and
    performing, by the spare memory device, a data input and output (input/output) operation.

13. The operation method of claim 12, further comprising performing, by the normal memory device, a data input/output operation, when the row hammering did not occur.

14. The operation method of claim 12, further comprising transferring and storing data stored in the normal memory device into the spare memory device, when a command signal related to the row hammering address signal is not a write signal, after the coupling of the normal memory device to the spare memory device.

15. The operation method of claim 12, further comprising transferring and storing the data stored in the spare memory device into the normal memory device, when a refresh operation is performed on the normal memory device.

16. The operation method of claim 15, further comprising determining whether one or more write signals have been included in command signals related to the row hammering address signal, before the transferring and storing of the data.

17. The operation method of claim 16, wherein when no write signals are included in the command signals related to the row hammering address signal, the transferring and storing of the data is not performed.

18. The operation method of claim 15, further comprising performing, by the normal memory device, a data input/output operation, after the transferring and storing of the data.

19. A memory module comprising:
a normal memory device;
a spare memory device; and
a row hammering determination circuit configured to control the spare memory device to perform a data input and output operation, instead of a data input and output operation with the normal memory device in which row hammering has occurred.

20. The memory module of claim 19, further comprising:
a path selection circuit coupled to one of the normal memory device and the spare memory device based on whether row hammering has occurred in the normal memory device.

* * * * *